(12) United States Patent
Odashima et al.

(10) Patent No.: US 6,557,925 B2
(45) Date of Patent: May 6, 2003

(54) VEHICLE INNER CIRCUIT PANEL, VEHICLE PANEL ASSEMBLY AND VEHICLE PANEL ASSEMBLY WIRING CONSTRUCTION

(75) Inventors: Yoshiharu Odashima, Yokkaichi (JP); Masashi Sugiyama, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 09/900,194

(22) Filed: Jul. 9, 2001

(65) Prior Publication Data

US 2002/0041110 A1 Apr. 11, 2002

(30) Foreign Application Priority Data

Jul. 10, 2000 (JP) ........................................ 2000-208971

(51) Int. Cl.$^7$ .................................................. B60J 5/00
(52) U.S. Cl. ..................... 296/146.7; 296/191; 296/901
(58) Field of Search ............................. 296/191, 146.7, 296/146.1, 214, 901, 39.1

(56) References Cited

U.S. PATENT DOCUMENTS

| | | | | |
|---|---|---|---|---|
| 4,907,836 A | * | 3/1990 | Ueda et al. ............... | 296/146.7 |
| 5,685,632 A | | 11/1997 | Schaller et al. | |
| 6,126,228 A | | 10/2000 | Davis, Jr. et al. | |
| 6,216,671 B1 | | 4/2001 | Sawert et al. | |

FOREIGN PATENT DOCUMENTS

| | | | |
|---|---|---|---|
| JP | 10237331 | | 9/1998 |
| JP | 11261194 A | * | 9/1999 |
| JP | 11342522 | | 12/1999 |
| JP | 2001245421 A | * | 9/2001 |
| JP | 2001251727 A | * | 9/2001 |
| JP | 2001273939 A | * | 10/2001 |

OTHER PUBLICATIONS

English Language Abstract of JP 10–237331.
English Language Abstract of JP 11–342522.

* cited by examiner

Primary Examiner—D. Glenn Dayoan
Assistant Examiner—Jason Morrow
(74) Attorney, Agent, or Firm—Greenblum & Bernstein, P.L.C.

(57) ABSTRACT

A vehicle circuit panel is provided that includes a base member formed of an electrically insulating plastic material and a conducting plastic circuit path formed of an electrically conducting plastic material. The conducting plastic circuit path is formed unitarily with the base member, and is at least partially embedded in the base member, thereby forming a one-piece molded plastic member. Thus, the conducting plastic circuit path is formed into a desired circuit configuration within the base member. With the above construction, the conducting plastic circuit path can be formed into any circuit configuration, thereby increasing the degree of freedom of design of the arrangement of the circuit path.

15 Claims, 16 Drawing Sheets

VEHICLE INNER CIRCUIT PANEL, VEHICLE PANEL ASSEMBLY AND VEHICLE PANEL ASSEMBLY WIRING CONSTRUCTION

BACKGROUND OF THE INVENTION

1. Field of the Invention

The present invention relates to a vehicle inner circuit panel with a conducting plastic circuit path, in particular, for use in vehicle panel assemblies such as door and room panel assemblies. Further, the present invention relates to a vehicle panel assembly with the conducting plastic circuit path and to a vehicle panel assembly wiring construction.

2. Description of Prior Art

Conventionally, as shown in FIGS. 7 and 8, wire harnesses 32, 42 (which are produced by bundling a plurality of electric wires) are utilized to supply power to electrical components in the vehicle door 31 and roof 41, respectively.

As shown in FIG. 7, the door wire harness 32, routed to such electrical components as electrically-operated door locks and side view mirrors, extends sinuously in the limited vehicle space to prevent interference with a flashing or sharp edge that occurs around a spot weld. To prevent interference with the flashing, protecting members 33 are also mounted on the wire harness 32. A corrugated tube, polyvinyl chloride sheet (PVC sheet), polyvinyl chloride tube (PVC tube), or acetate tape can be used as the protecting member. For example, FIG. 9 shows a corrugated tube 33 which is mounted as the protecting member on the wire harness 32.

As shown in FIG. 8, the roof wire harness 42 is routed at the back of the ceiling, extending to the operating interior lights such as the dome light 43 and vanity mirror lights 44. The roof harness 42 is fixed at several places by a fixing member such as the tape 45, and extends so that its connectors 46,47 face the openings 48,49 of the roof 41. The respective connectors 46,47 are connected to the operating interior lights 43, 44 through the openings 48,49.

The prior art wiring construction as described above has the following problems.

First, the degree of freedom of design regarding the routing paths of the wire harnesses 32, 42 is limited. It is difficult to set a routing path that involves rapid curves because the wire harnesses 32, 42 are hard to bend. It is also difficult to set a three dimensional routing path because of the limited routing space in the door 31 and roof 41.

Second, the wire harnesses 32, 42 require tight dimensional tolerances for the lengths of main trunks and branches and for the mounting positions of the protecting members 33. It is difficult and cumbersome to maintain the tight dimensional tolerances. Further, the process of fixing the wire harnesses at several places by tape is tedious and inconvenient.

Third, it is tedious and inconvenient to manage the various kinds of protecting members 33. More specifically, it is tedious and inconvenient to select most appropriate protecting members among the various kinds of protecting members, taking into account the flashing and edge conditions and the required degree of soundproofing; and to mount the selected protecting members appropriately.

SUMMARY OF THE INVENTION

The present invention has been developed, taking the above problems into account. An object of the present invention is to increase the degree of freedom of design to arrange an electrical circuit path on a vehicle circuit panel such as vehicle door and roof circuit panels, and to improve circuit path forming workability. Another object of the present invention is to eliminate the labor-intensive protecting members.

To solve the above problems, the present invention provides a vehicle inner circuit panel that includes a base member formed of an electrically insulating plastic material and a conducting plastic circuit path formed of an electrically conductive plastic material. The conducting plastic circuit path is formed unitarily with the base member, and is at least partially embedded in the base member, thereby forming a one-piece molded plastic member. Thus, the conducting plastic circuit path is formed into a desired circuit configuration within the base member.

In accordance with this construction of the present invention, the vehicle inner circuit panel can be used as a circuit board. Additionally, the conducting plastic circuit path can be formed into any circuit configuration, thereby eliminating the constraints of location and configuration of the circuit path and thus increasing the degree of freedom of design of the arrangement of the circuit path. Also, the wire harness fixing process can be eliminated, thereby improving productivity significantly. Further, even a tight dimensional tolerance can be readily accommodated with a suitable mold. Finally, since the conducting plastic circuit path is embedded in the base member, it becomes easy to prevent interference with a flashing or a sharp edge, thus eliminating the labor-intensive protecting members.

In another aspect of the present invention, the vehicle inner circuit panel has a contact portion that projects from the conducting plastic circuit path into a socket of a connector housing made of an electrically insulating plastic material. Preferably, the contact portion is a metal contact member formed integrally with the plastic circuit path. For example, the metal contact member may be molded into the conducting plastic circuit path during its manufacture. Alternatively, the metal contact member may be press fit or attached within an opening or a recess of the conducting plastic circuit path. Also, the contact portion may be made of the electrically conductive plastic material and formed unitarily with the circuit path.

In a further aspect of the present invention, the connector housing is formed unitarily with the base member.

In another aspect of the present invention, the vehicle circuit panel has a mounting cover made of a non-conductive hard plastic material and a housing portion made of the non-conductive hard plastic material. The housing portion is formed unitarily with the mounting cover. The mounting cover is mounted on the one-piece molded plastic member, and the contact portion projects into the socket of the housing portion.

In yet another aspect of the present invention, the conducting plastic circuit path is embedded in such a manner as to be generally coplanar with the base member, thereby forming a generally flat surface on the one-piece molded plastic member. The conducting plastic circuit path is exposed on the flat surface. Hence, to cover the exposed circuit path, an electrically insulating cover sheet is mounted on the flat surface. Preferably, the cover sheet is formed of a relatively soft resin, thereby increasing the shock absorption as well as the electrical insulation of the one-piece molded plastic member. Of course, instead of the cover sheet, the mounting cover may be mounted on the flat surface.

Moreover, the present invention provides a vehicle panel assembly that includes a vehicle body panel, an interior trim panel engageable with the vehicle body panel, and a plastic circuit panel disposed between the vehicle body panel and the interior trim panel. The plastic circuit panel has a base member formed of an electrically insulating plastic material and a conducting plastic circuit path formed of an electrically conductive plastic material. An electrical component is mounted on at least one of the three panels, and is configured to be electrically connected to the conducting plastic circuit path. Preferably, the plastic circuit panel is a one-piece member formed by molding the circuit path unitarily with the base member, whereby the plastic circuit path is formed into a desired circuit configuration.

In another aspect of the present invention, the plastic circuit panel has a first connector which is connected to the conducting plastic circuit path and which is configured for engagement with a mating connector of an outer wire harness that extends from outside the vehicle body panel. Thus, the plastic circuit path can be readily connected to the outer wire harness upon engagement of the first and mating connectors. The plastic circuit panel further has a second connector which is connected to the conducting plastic circuit path and which is configured for engagement with a component side connector of an inner wiring member that extends from the electrical component. Thus, upon engagement of the second and component side connectors, the circuit path can be readily connected to the electrical component. Therefore, the outer wire harness can be connected to the electrical component.

Furthermore, the present invention provides a vehicle panel assembly wiring construction for supplying power to the above vehicle panel assembly. In addition to the vehicle body panel, the wiring construction includes an outer wire harness that extends from outside the vehicle body panel to supply power to the electrical component. The outer wire harness has a power supply side connector which is connected to an end thereof and which is engageable with the first connector connected to the conducting plastic circuit path at one end thereof. The wiring construction further includes an inner wire harness that extends from the electrical component to the second connector which is connected to the plastic circuit path at the other end thereof. The inner wire harness has an electrical component side connector which is connected to an end thereof and which is engageable with the second connector. The first and second connectors are respectively coupled to the power supply side and electrical component side connectors. Consequently, the outer wire harness is electrically connected to the electrical component through the conducting plastic circuit path and the inner wire harness, thereby supplying power to the electrical component.

The term "vehicle body panel" used herein includes, but is not limited to a door body panel, a roof body panel, a floor body panel and a firewall.

The term "interior trim panel" used herein includes, but is not limited to a door interior trim panel, a roof interior trim panel, an interior floor carpet, an instrumental panel and a center cluster panel.

The term "electrical component" used herein includes, but is not limited to electrical devices such as electrically-operated door lock, power window, side view mirror and operating interior light devices which are disposed between the vehicle body panel and interior trim panel or which are disposed on at least one of the vehicle body panel, interior trim panel and plastic circuit panel.

The term "electrically conductive plastic material" used herein includes, but is not limited to a high conductivity resin composition which can be formed as disclosed in Japanese Unexamined Patent Publication Nos. Hei 10-237331 and Hei 11-342522, for example, by:

(a) blending metallic fiber such as copper, nickel and iron (singly or in combination) into thermoplastic resin, or (b) blending a low melting point alloy such as solder (low melting point solder), along with Cu powder, into thermoplastic resin, and dispersing them to cross-link.

For the thermoplastic resin, polypropylene, polyethylene, polystyrene, polyacrylonitrile-butadiene-styrene, modified polyphenylene oxide, polybutyleneterephthalate, polyethyleneterephthalate, polyamide, aromatic polyamide, polyphenylenesulfide, liquid crystal polymer, polyetherimide, polybenzimidazole, polyetherketone and polyethersulfone, in particular, can be used, either singly or in combination, to form the electrically conductive plastic material. Particularly preferred resins are acrylonitrile-butadiene-styrene and polybutyleneterephthalate.

The low melting point alloy, which is blended to be dispersed to cross-link in the thermoplastic resin, should be of the kind with a melting point of more than 100 degrees, preferably more than 200 degrees, and which melts well during injection molding. For example, Sn—Pb, Sn—Ag—Pb, Sn—Bi, Sn—Bi—In, Bi—Pb, Bi—Sn, Sn—Cu, Sn—Cu—Ni—Pb, Sn—Ag, Sn—Bi—Pb and Sn—In based alloys may be suitable for the purpose of the present invention. Lead-free solder is a particularly preferred low melting point alloy.

Alternatively, the electrically conductive plastic materials such as those described in U.S. Pat. No. 5,685,632 and U.S. Pat. No. 6,216,671 can be used for the purpose of the present invention. Of course, any suitable electrically conductive plastic materials which are formed from plastic materials other than those described above or disclosed in the above U.S. and Japanese publications, can also be used for the purpose of the present invention and will fall within the intended scope of the present invention.

With respect to the electrically insulating plastic material, conventional thermoplastic and thermosetting resins can be used to form, for example, the base member, the insulating cover and the housing of the present invention.

BRIEF DESCRIPTION OF THE DRAWINGS

The present invention is further detailed in the description which follows, in reference to the noted plurality of drawings by way of non-limiting examples of exemplary embodiments of the present invention, in which like reference numerals represent similar parts throughout the several views of the drawings, and wherein.

DETAILED DESCRIPTION OF PREFERRED EMBODIMENTS

The first embodiment of the present invention will be described with reference to the drawings.

Figure 1:
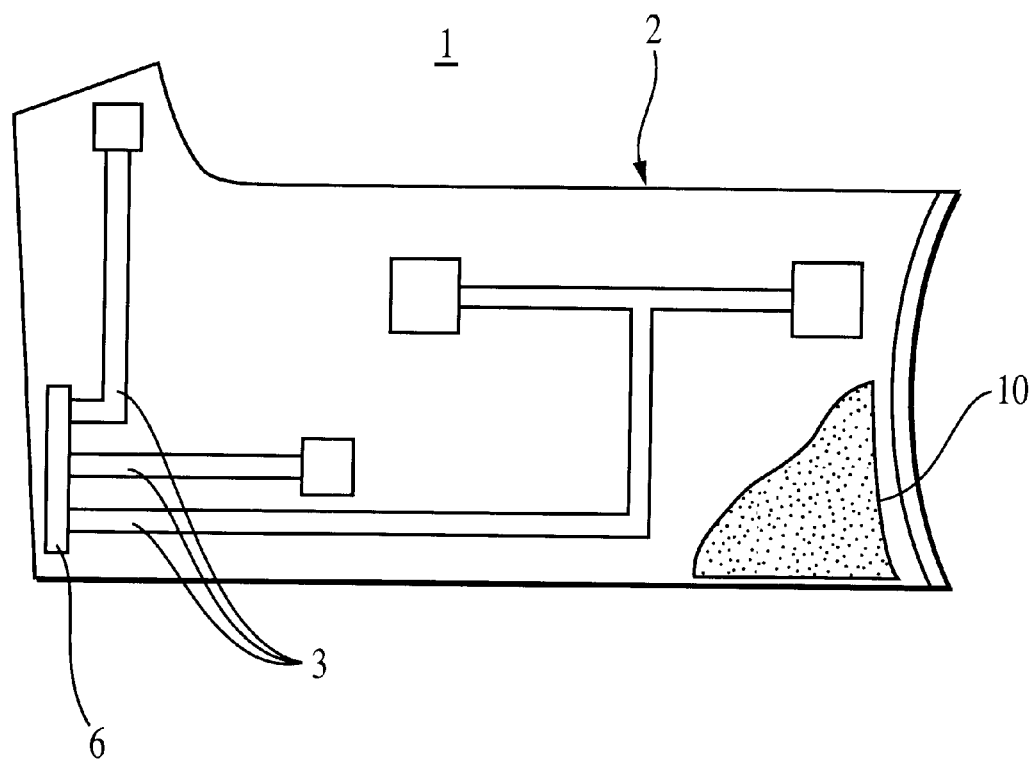
FIG. 1 is a front view of a door circuit panel as a vehicle circuit panel of the first embodiment.

FIGS. 1, 2, 3A–3I and 4–5 depict a door circuit panel as a vehicle inner circuit panel (i.e., plastic circuit panel) of the first embodiment. As shown in FIG. 1, the door circuit panel 1 has a molded plastic member 2. The molded plastic member 2 is formed by unitarily molding an electrically non-conductive, insulating plastic material and an electrically conductive plastic material. Preferably, the electrically conductive plastic material is in the form of a high conductivity resin composition, to be described later.

More specifically, as best seen in FIGS. 3A–3H, the molded plastic member 2 has a base member 5 formed of the non-conductive plastic material. Preferably, the non-conductive plastic material is a thermoplastic resin similar to that used to form the high conductivity resin composition. Embedded in the base member 5 are a plurality of conducting portions 4 that constitute conducting plastic circuit paths 3. The plastic circuit paths 3 are formed of high conductivity resin composition, and configured into a desired electrical circuit pattern. As best seen in FIG. 4, the molded plastic member 2 is disposed in a door DR so that the conducting plastic circuit paths 3 face the interior of a vehicle from the inner side of the door DR. In a preferred embodiment, the conducting plastic circuit paths 3 are formed unitarily with the base member 5. However, the conducting circuit paths 3 may be attached to the base member 5 in any suitable manner, as for example, by use of an adhesive.

Figure 3A:
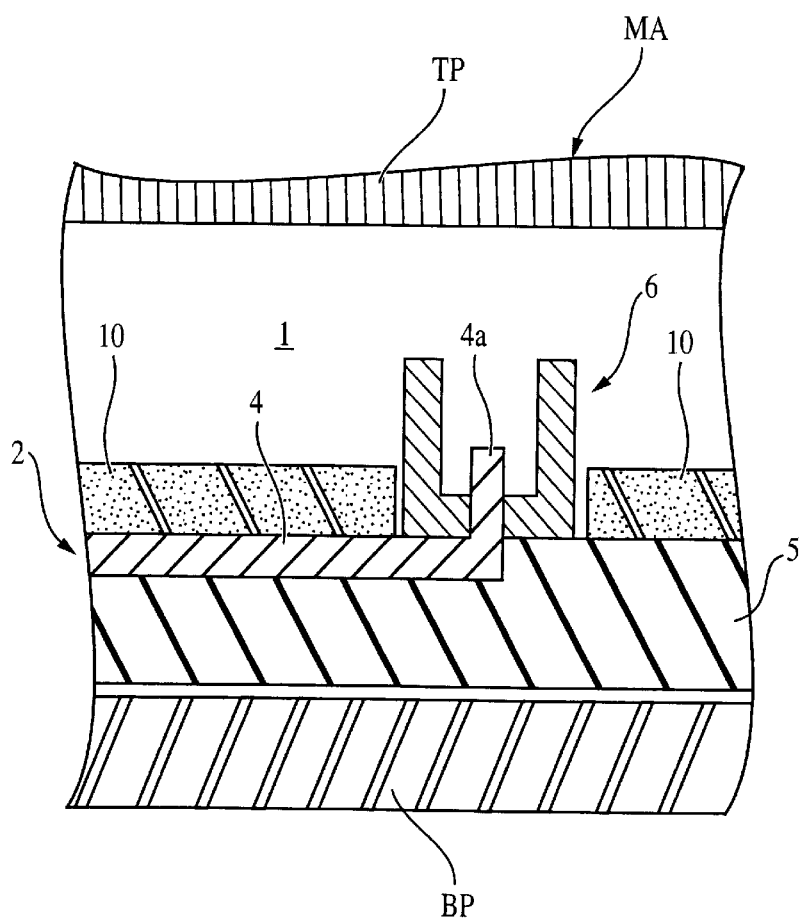
FIG. 3A is a partial sectional view illustrating a structural relationship of the relevant elements (including the conducting portion) of the door circuit panel of the first embodiment, and a positional relationship of the door circuit panel relative to the door body panel and the door interior trim panel.
Figure 3B:
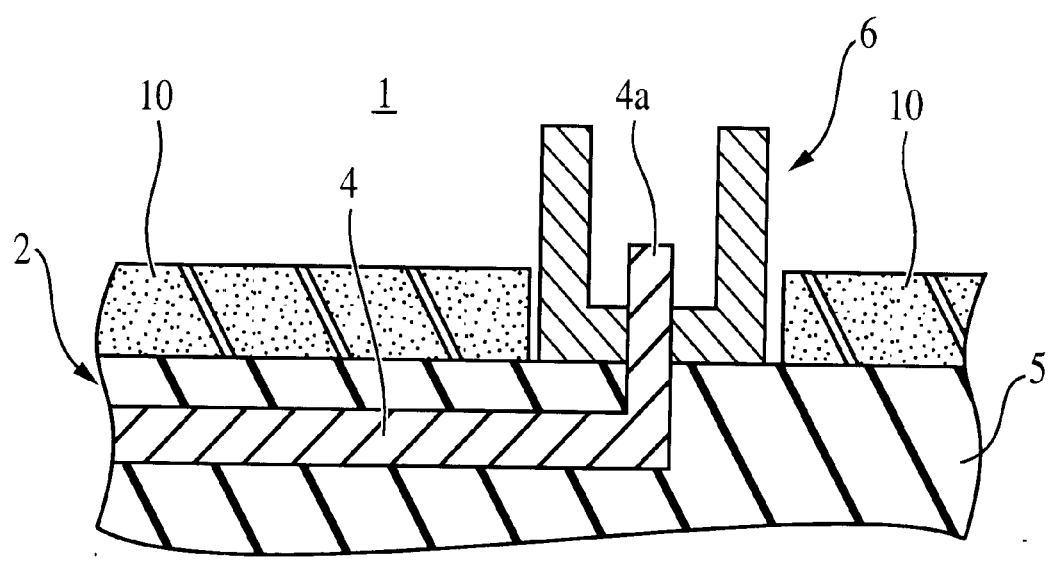
FIGS. 3B–3I are partial sectional views showing variations of the structural relationship of the door circuit panel of the first embodiment, but do not show the positional relationship to avoid the redundancies.

As best seen in FIG. 3A, the door circuit panel 1 is disposed between a door body panel BP and a door interior trim panel TP. Preferably, the door circuit panel 1 is mounted on the door body panel BP to form a door module assembly MA (which combines the panels 1, TP, BP). To form the door module assembly MA, however, the door circuit panel 1 may also be mounted on the door interior trim panel TP. It should be noted here that, even though no disclosure of the panels BP, TP is given to avoid redundancies in the drawings, the door circuit panels 1 as shown in FIGS. 3B–3I are provided between the panels BP, TP, as in the case of the door circuit panel shown in FIG. 3A. Moreover, it should also be noted that it is not always necessary to secure the conducting circuit paths to the vehicle body.

Figure 2:
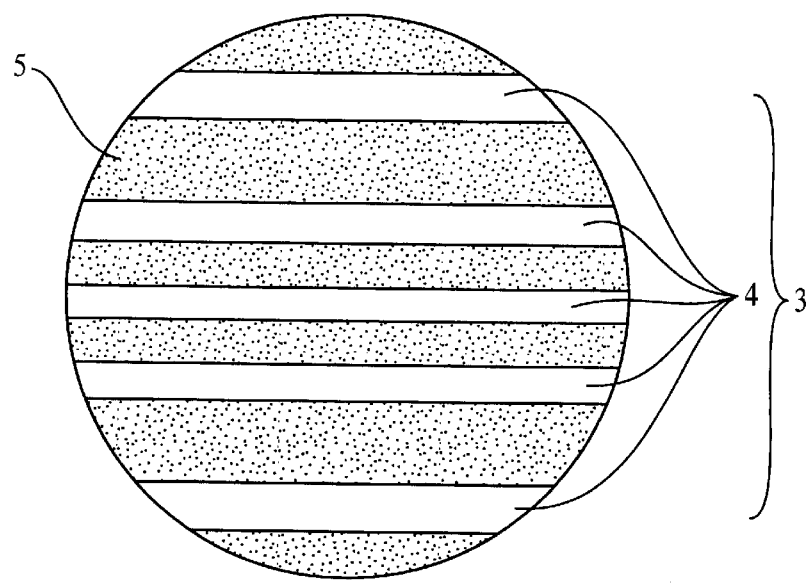
FIG. 2 is a partial plan view illustrating conducting portions of the door circuit panel of the first embodiment.

The conducting portions 4 are separated and insulated from one another, for example, on the surface of the molded plastic member 2 as shown in FIG. 2. As best seen in FIGS. 3A, 3C, 3E, 3G and 3I, only the surface of the conducting portion 4 is exposed, and the remaining portion of the conducting portion 4 is embedded in the base member 5. In other words, the conducting portion 4 is embedded in such a manner as to form a generally coplanar surface with the base member 5.

Of course, the entire conducting portion 4 may be embedded in the base member 5. For example, FIGS. 3B, 3D, 3F and 3H depict the entire conducting portion 4 embedded in the base member 5 so that the surface of the conducting portion 4 does not become exposed.

The high conductivity resin composition, which is used to form the conducting portions 4, can be formed, for example, by:

(a) blending metallic fiber such as copper, nickel and iron (singly or in combination) into thermoplastic resin, or;

(b) blending a low melting point alloy such as solder (low melting point solder), together with Cu powder, into thermoplastic resin and dispersing them to cross-link.

In a preferred embodiment, the conducting portions 4 are formed unitarily with the base member 5. Alternatively, the conducting portions 4 may be formed separately and attached to the base member 5 in any suitable manner.

As shown in FIGS. 3A–3I, an electrically conductive tab 4a is provided projecting from the conducting portion 4 and above an end surface of the molded plastic member 2, and is accommodated within a connector 6 (i.e., first connector). The connector 6 is provided at one end of the conducting plastic circuit path 3, and is coupled to a mating connector MC (i.e., power supply side connector) connected to an end of a vehicle body side wire harness or an outer wire harness OWH (note FIG. 4). Therefore, by interconnecting the connectors MC, 6, the outer wire harness OWH is connected to the conducting plastic circuit path 3.

Figure 3C:
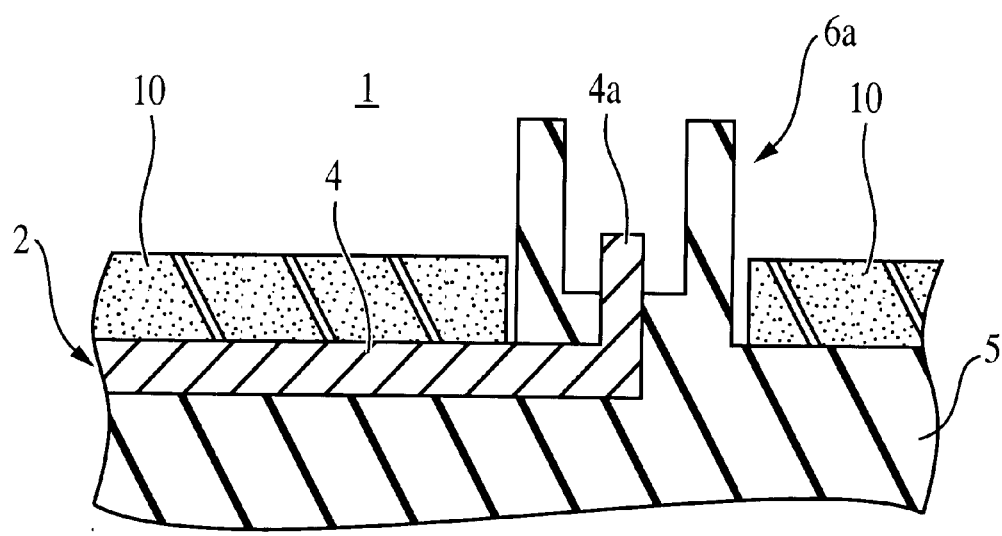
Figure 3D:
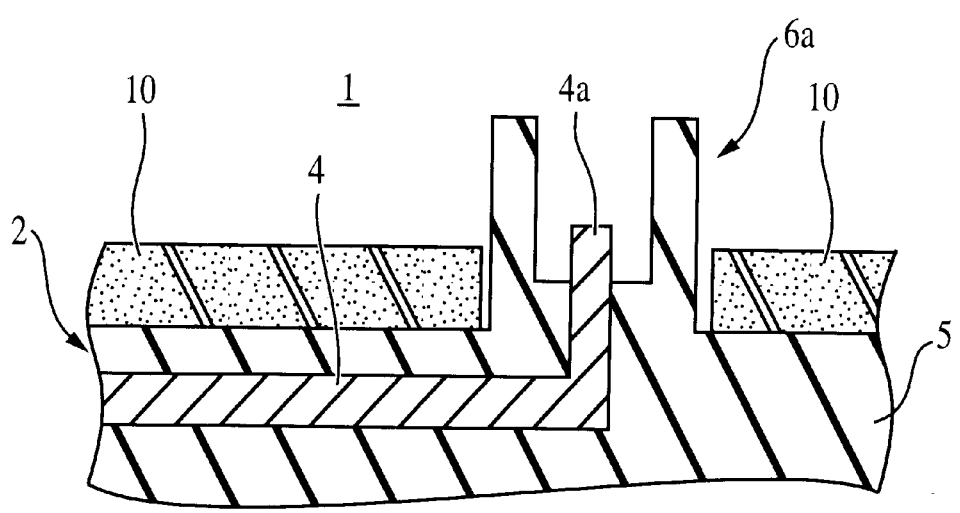
Figure 4:
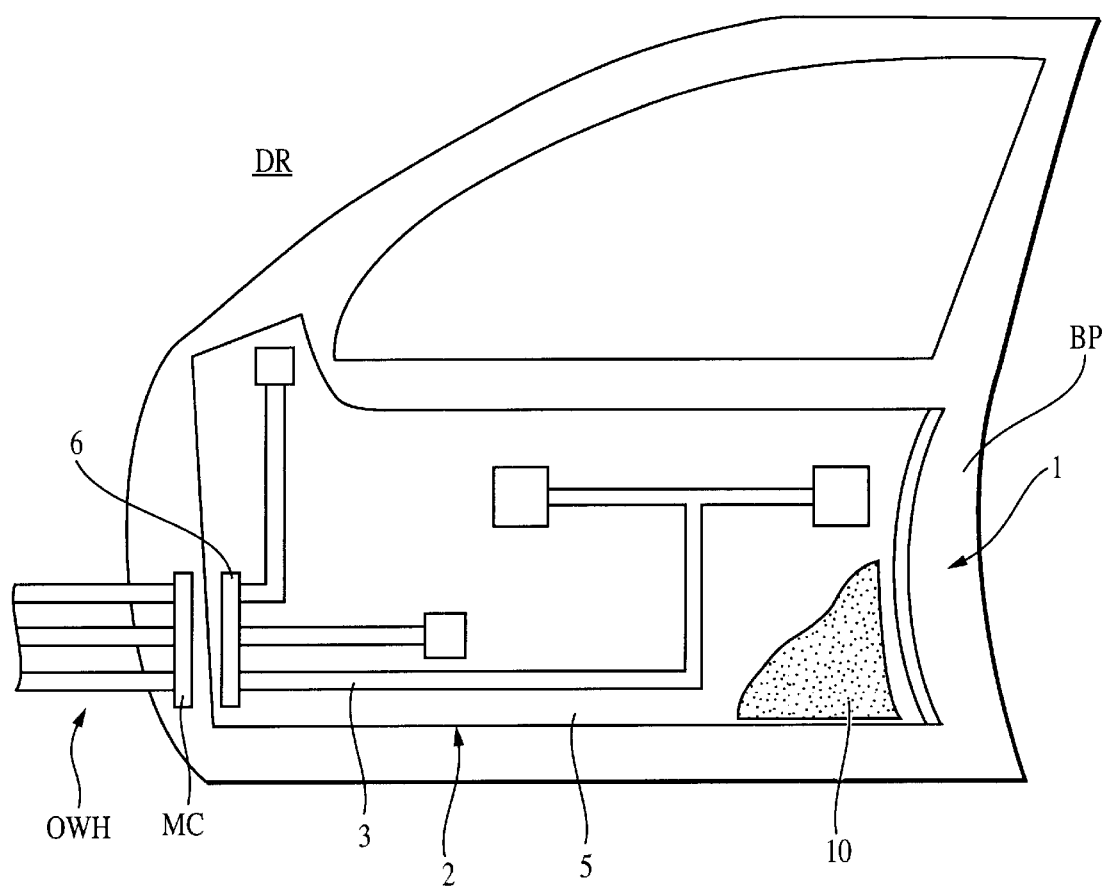
FIG. 4 is a front view illustrating a condition in which the door circuit panel of the first embodiment is mounted in the door.

The connector 6 is provided as a separate member, and attached to the base member 5 separately. However, the connector 6 may be formed unitarily with the base member 5 or the molded plastic member 2. For example, FIGS. 3C–3D depict a connector housing portion 6a formed unitarily in one piece with the base member 5 or the molded plastic member 2.

Figure 3E:
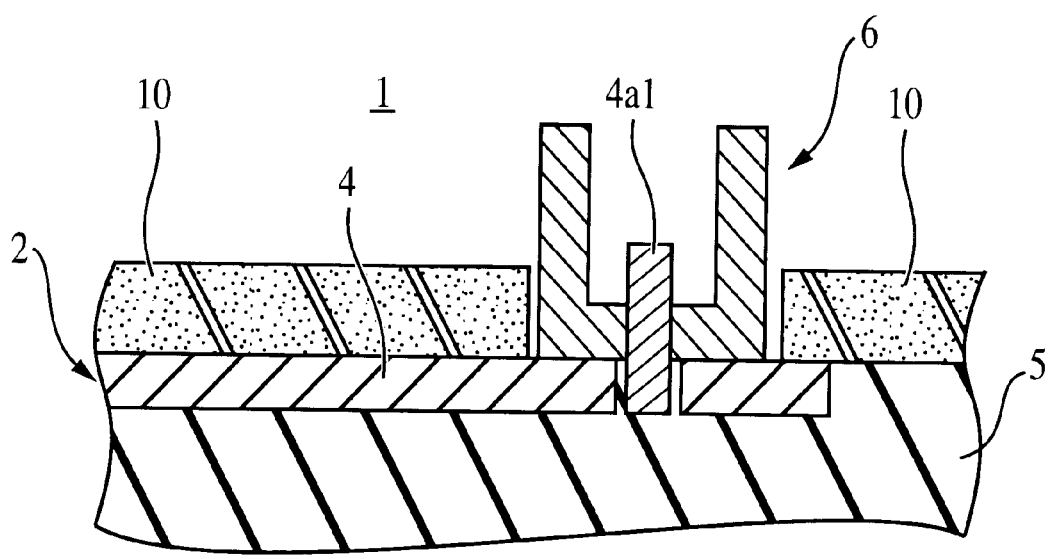
Figure 3F:
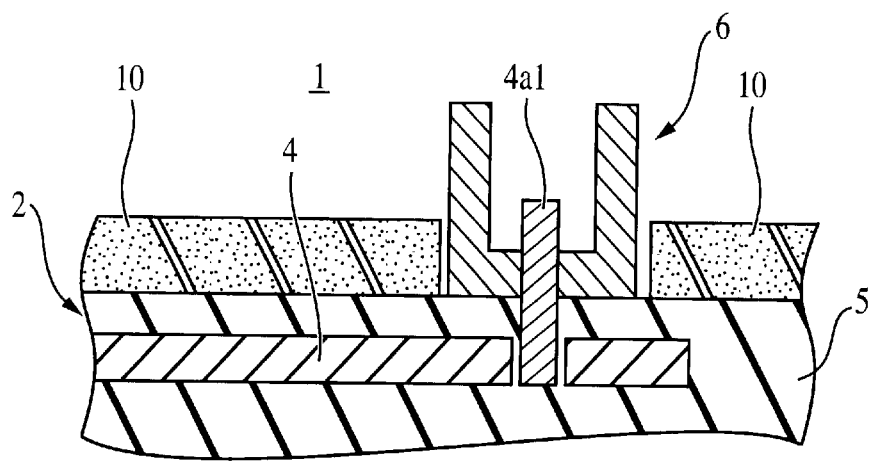
Figure 3G:
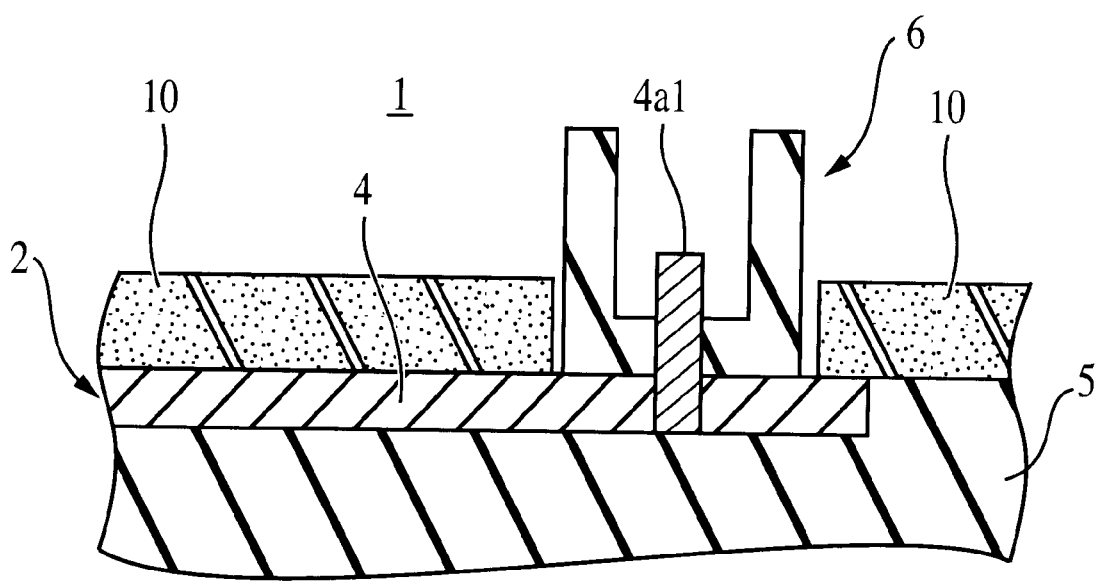
Figure 3H:
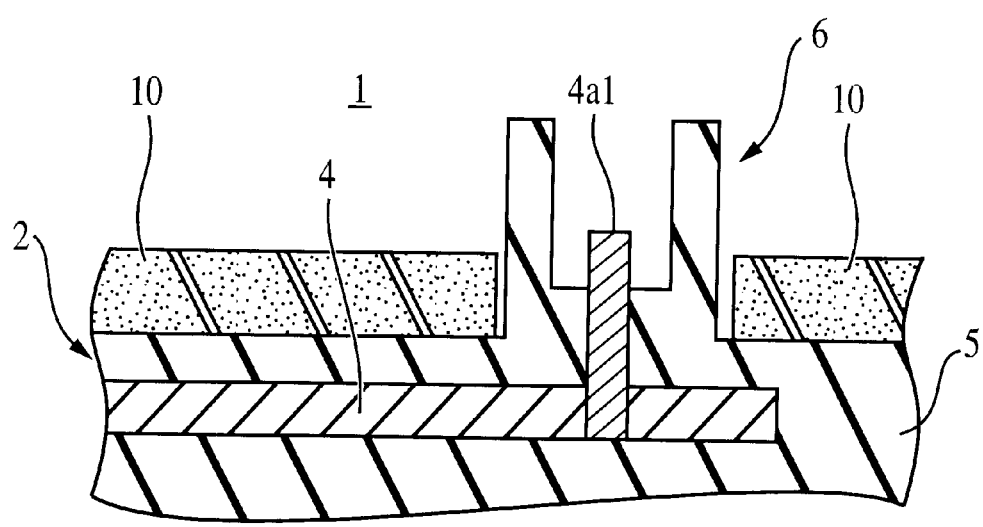

As shown in FIGS. 3A–3D, the tab 4a is made of the high conductivity resin composition, and is formed unitarily in one piece with the conducting portion 4. However, the tab 4a may be formed as a separate element and attached to the conducting portion 4 in any suitable manner. For example, the tab 4a may be formed from a metal strip. FIGS. 3E–3F depict a metal tab 4a1 press-fit into the conducting portion 4, and FIGS. 3G–3H depict the metal tab 4a1 insert molded into, and thus formed integral with the conducting portion 4.

Figure 5:
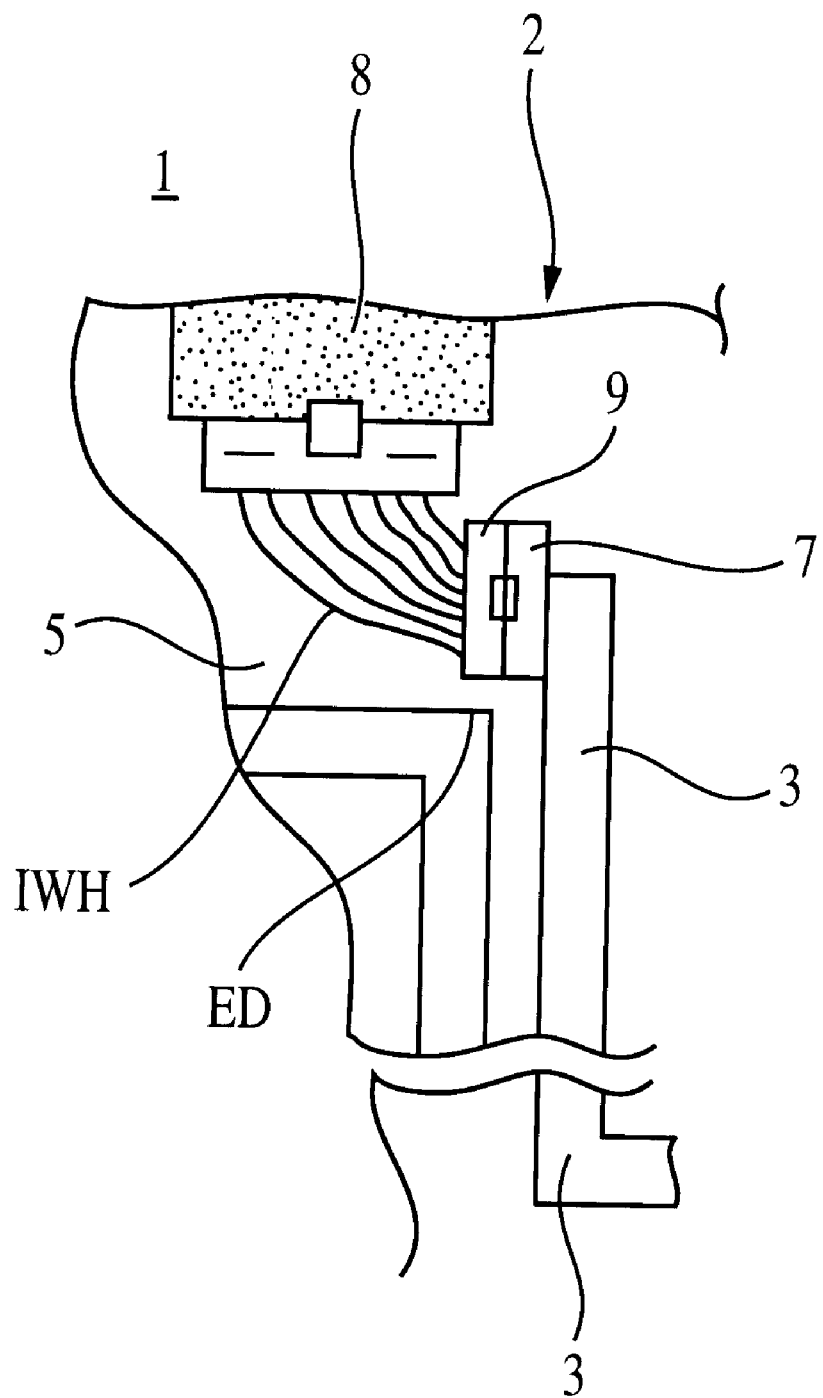
FIG. 5 is a partial front view illustrating a condition in which the electrical component is mounted on the door circuit panel of the first embodiment.

FIG. 5 depicts a connector 7 (i.e., second connector) that is connected to the other end of the circuit path 3 (i.e., at the end opposite to the connector 6 side end). The connector 7 is configured for engagement with an electrical component side connector 9 that is connected to an end of an inner wire harness IWH. The inner wire harness IWH extends from an electrical component 8 (e.g., electrically-operated door locks and side view mirrors) which is mounted on the door circuit panel 1. Accordingly, when the connectors 7, 9 are coupled together, the conducting plastic circuit path 3 is connected to the electrical component 8 through the inner wire harness IWH. Therefore, by interconnecting the connectors MC, 6, 7, 9, the outer wire harness OWH can be electrically connected to the electrical component 8 through the conducting plastic circuit path 3 and the inner wire harness IWH. The electrical component side connector 9 may be connected to the electrical component 8 through any conventional wiring member such as a metal busbar, rather than the inner wire harness IWH. Also, the electrical component 8 may be directly connected to the conducting plastic circuit path 3.

As best seen in FIGS. 3A, 3C, 3E, 3G and 3E, a cover 10 is mounted on the surface of the molded plastic member 2 to cover the exposed plastic circuit paths 3. Preferably, the cover 10 is in the form of a sheet made of any suitable non-conductive material, for example, a relatively soft, electrically non-conductive plastic material, and provides improved electrical insulation and shock absorption in the door circuit panel 1.

Figure 3I:
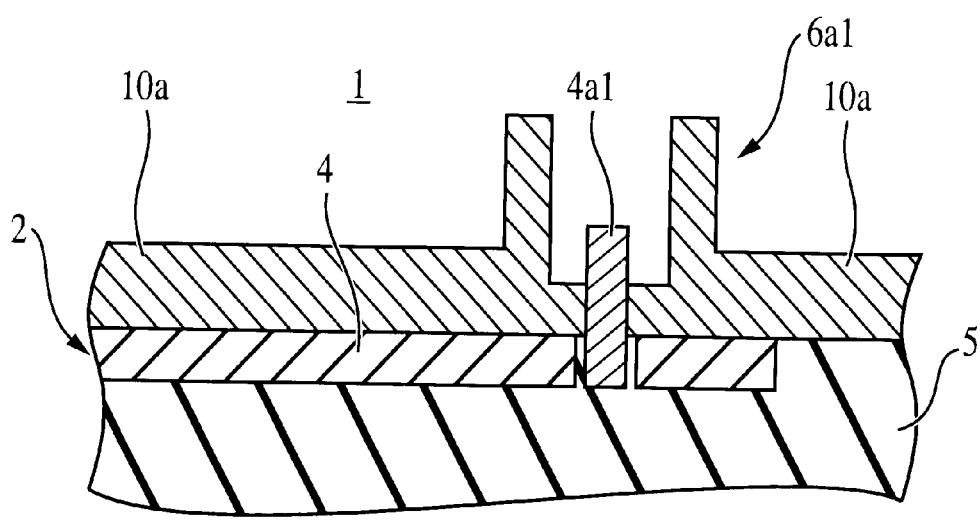

In a preferred embodiment, as shown in FIG. 3I, a mounting cover 10a is mounted on the molded plastic member 2. The mounting cover 10a is formed of a non-conductive hard resin, and is formed unitarily with a housing portion 6a1 made, for example, of the non-conductive hard resin. The tab 4a1 projects into the socket of the housing portion 6a1.

For example, the molded plastic member 2 is formed unitarily in one piece as follows:

First, the high conductivity resin composition is introduced into a cavity of a circuit-forming mold (not shown) and then heated and pressurized, thereby forming the conducting portions 4 and the tabs 4a that project from the conducting portions 4.

Second, the circuit-forming mold is set in a condition to form the base member 5, and the insulating plastic material, which is similar to the high conductivity resin composition, is introduced, and then heated and pressurized, thereby molding the conducting portions 4 and the base member 5 unitarily to form the one-piece molded plastic plate 2.

Figure 6:
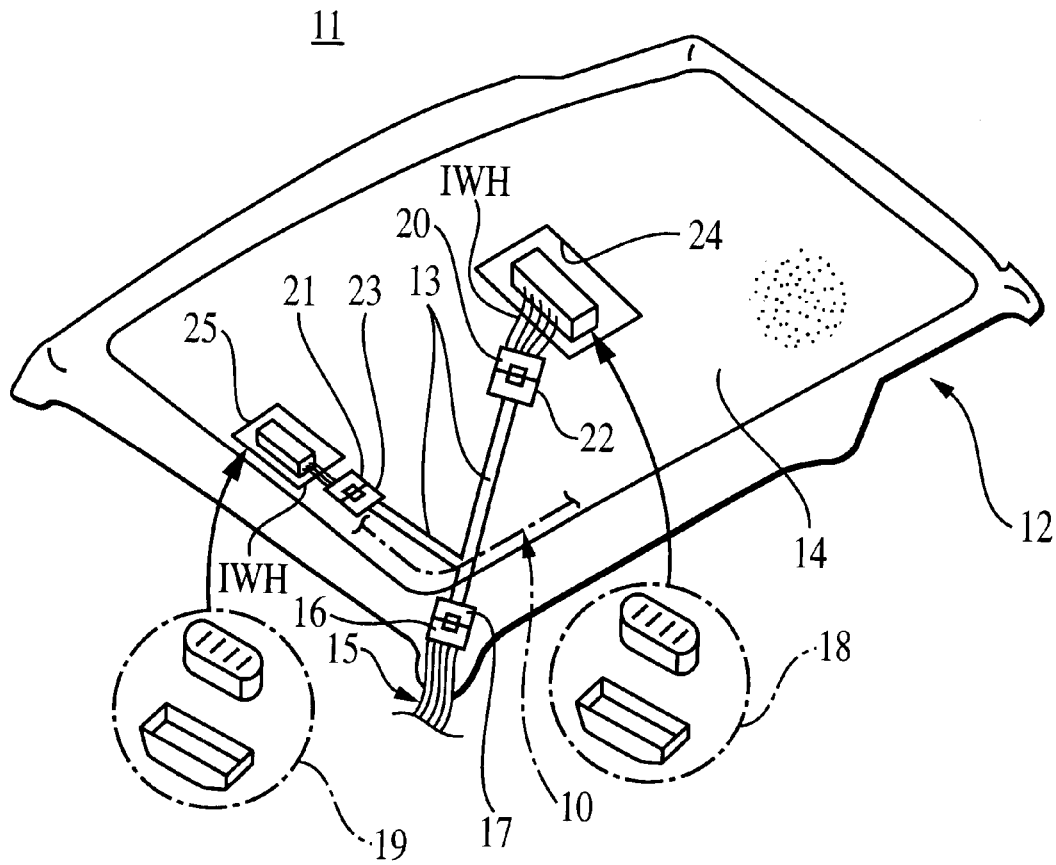
FIG. 6 is a schematic view of a roof circuit panel as a vehicle circuit panel of the second embodiment.
Figure 7:
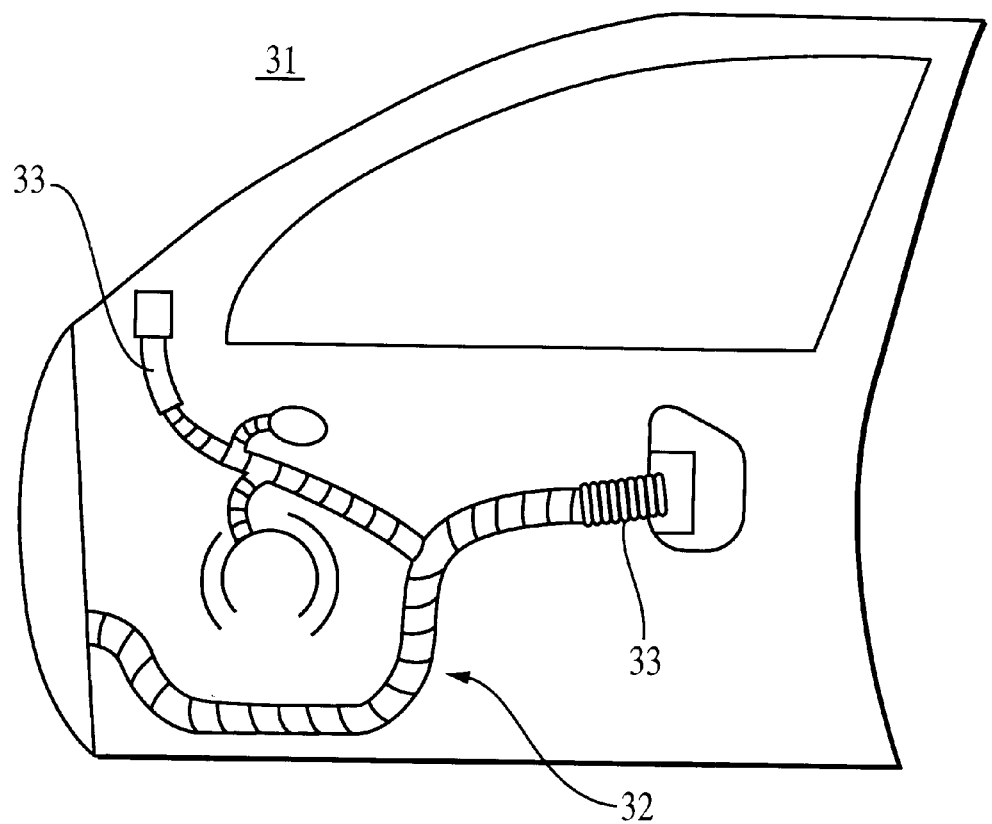
FIG. 7 is a schematic view illustrating a condition in which a conventional door wire harness is routed in the door.
Figure 8:
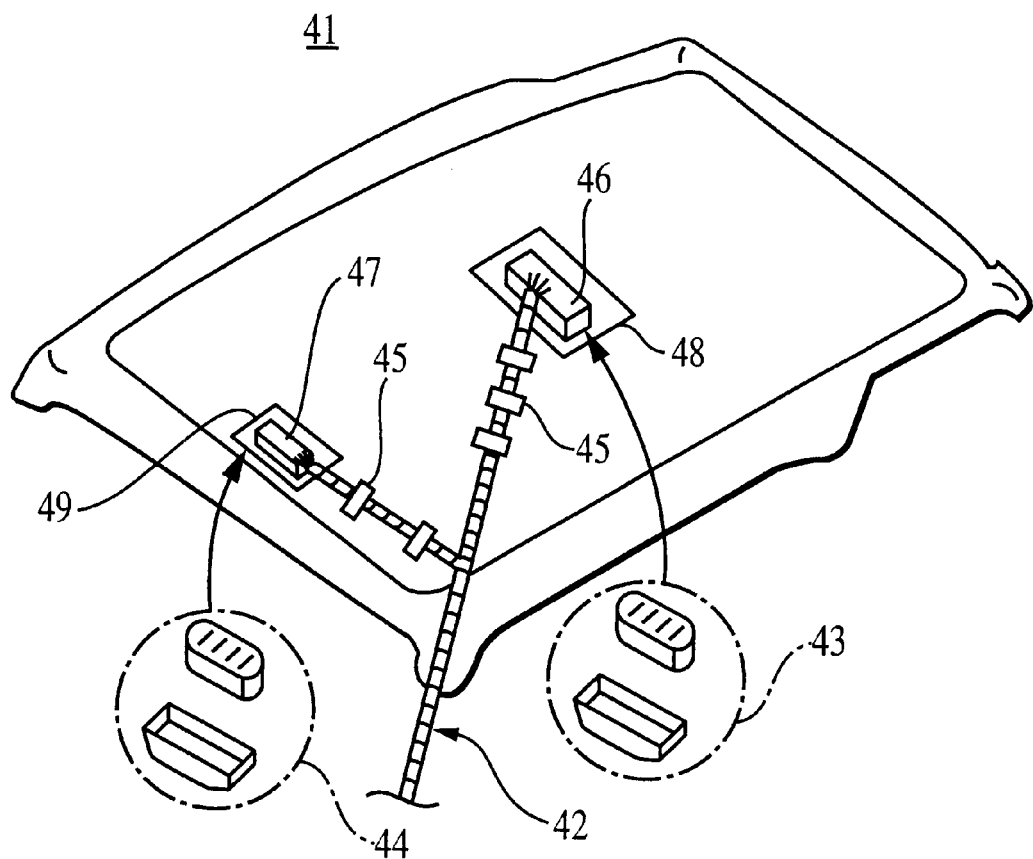
FIG. 8 is a schematic view illustrating a condition in which a conventional wire harness is routed in the roof.
Figure 9:
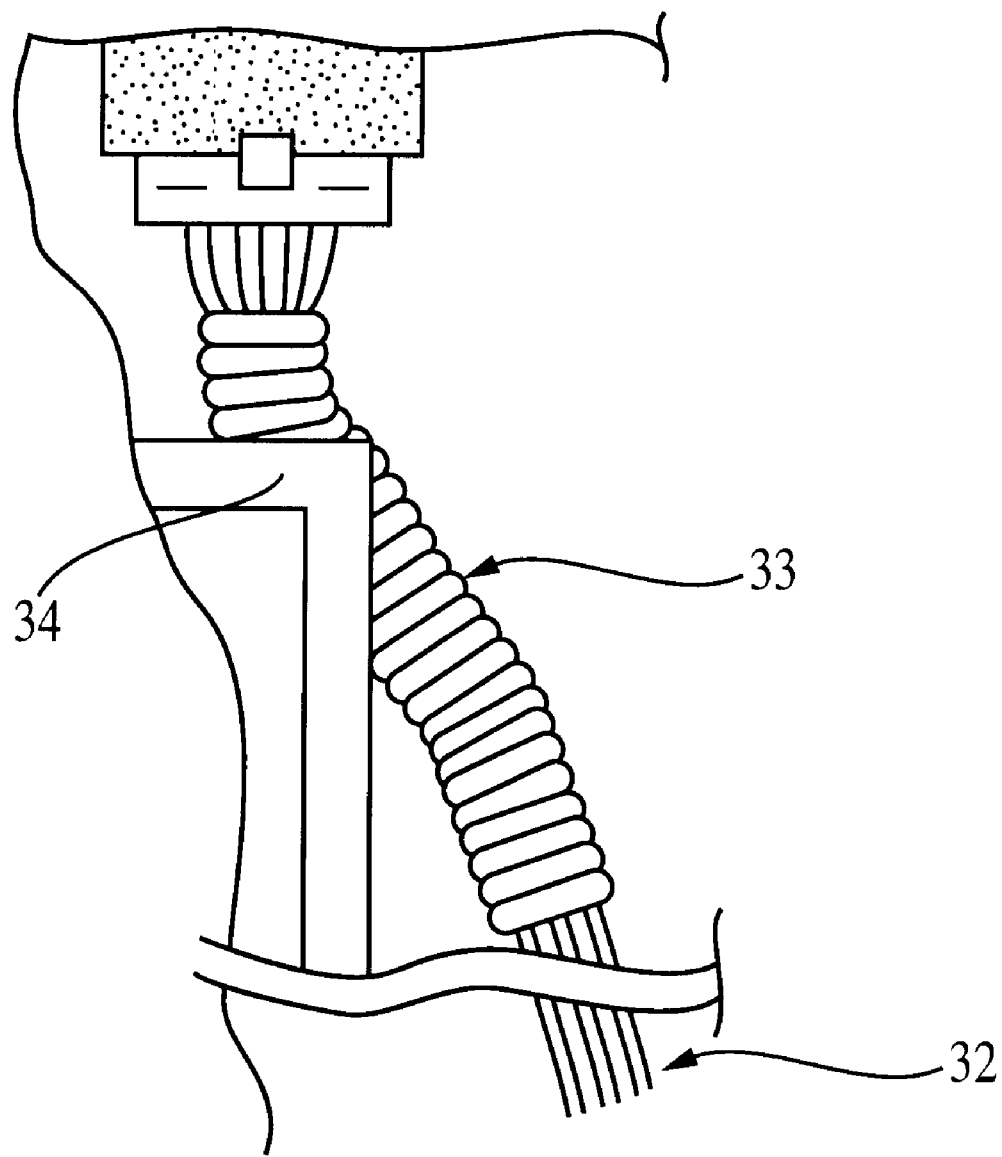
FIG. 9 is a partial front view illustrating how the conventional door wire harness avoids a sharp edge.

FIG. 6 illustrates a roof circuit panel as a vehicle inner circuit panel of the second embodiment (i.e., plastic circuit panel).

As in the case of the first embodiment, the roof vehicle interior panel 11 has a molded plastic panel 12. The molded plastic panel 12 is formed by unitarily molding the non-conductive plastic material and the high conductivity resin composition. Conducting portions 13 are formed of the high conductivity resin composition, and are at least partially embedded in the base member 14 formed of the non-conductive plastic material.

As in the case of the connector 6 of the first embodiment, a connector 17 (i.e., first connector) is provided at one end of the conducting plastic circuit path 13, and connected to a mating connector 16 (i.e., power supply side connector) provided at an end of a vehicle body side or an outer wire harness 15. Also, as in the case of the connector 7 of the first embodiment, connectors 22, 23 (i.e., second connectors) are provided at the other ends of the conducting plastic circuit paths 13, and coupled respectively to connectors 20, 21 (i.e., electrical component side connectors) that are provided at ends of inner wire harness IWH. The inner wire harnesses respectively extend from dome light 18 and vanity mirror lights 19 which are mounted on the roof circuit panel 11 as electrical components.

The molded plastic member 12 has openings 24, 25 to install the interior lights 18, 19. The interior lights 18, 19 are provided in the openings 24, 25, to be connected to the conducting plastic circuit paths 13 formed on the surface of the molded plastic panel 12, through the inner wire harness IWH. Accordingly, when the connectors 20, 21 are coupled to the connectors 22, 23, the outer wire harness 15 is electrically connected to the dome light 18 (through connector 16 connector 17 circuit path 13 connector 22 connector 20) and to the vanity mirror lights 19 (through connector 16 connector 17 circuit path 13 connector 23 connector 21).

Since the specific constructions of the circuit path 13 and other relevant elements of the second embodiment are substantially the same as those of the first embodiment, no description is given to those constructions.

It is noted that the foregoing examples have been provided merely for the purpose of explanation and are in no way to be construed as limiting of the present invention.

While the present invention has been described with reference to certain embodiments, it is understood that the words which have been used herein are words of description and illustration, rather than words of limitation.

Changes may be made, within the purview of the appended claims, as presently stated and as amended, without departing from the scope and spirit of the present invention in its aspects.

Although the present invention has been described herein with reference to particular means, materials and embodiments, the present invention is not intended to be limited to the particulars disclosed herein;

Rather, the present invention extends to all functionally equivalent structures, methods and uses, such as are within the scope of the appended claims.

The present disclosure relates to subject matter contained in priority Japanese Application No. Tokugan 2000-208971, filed on Jul. 10, 2000.

What is claimed is:

1. A vehicle inner circuit panel for use in a vehicle panel assembly, comprising:

a base member formed of an electrically insulating plastic material, a conducting plastic circuit path formed of an electrically conductive plastic material, and a metal contact member that projects from said conducting plastic circuit path into a socket of a connector housing made of an electrically insulating plastic material, wherein said conducting plastic circuit path is formed unitarily with said base member, and is at least partially embedded in said base member, thereby forming a one-piece molded plastic member, whereby said conducting plastic circuit path is formed into a desired circuit configuration within said base member.

2. The vehicle inner circuit panel according to claim 1, wherein said metal contact member is molded into said conducting plastic circuit path.

3. A vehicle inner circuit panel for use in a vehicle panel assembly, comprising:

a base member formed of an electrically insulating plastic material, a conducting plastic circuit path formed of an electrically conductive plastic material, and a plastic contact portion that projects from said conducting plastic circuit path into a socket of a connector housing made of an electrically insulating plastic material, wherein said contact portion is formed of the electrically conductive plastic material and is formed unitarily in one piece with said conducting plastic circuit path, and wherein said conducting plastic circuit path is formed unitarily with said base member, and is at least partially embedded in said base member, thereby forming a one-piece molded plastic member, whereby said conducting plastic circuit path is formed into a desired circuit configuration within said base member.

4. The vehicle inner circuit panel according to claim 1, wherein said connector housing is formed unitarily with said base member.

5. The vehicle inner circuit panel according to claim 3, wherein said connector housing is formed unitarily with said one-piece molded plastic member.

6. A vehicle inner circuit panel for use in a vehicle panel assembly, comprising:

a base member formed of an electrically insulating plastic material, a conducting plastic circuit path formed of an electrically conductive plastic material, a contact portion that projects from said conducting plastic circuit path, a mounting cover made of a non-conductive hard plastic material, and a connector housing portion made of the non-conductive hard plastic material and formed unitarily with said mounting cover, wherein said mounting cover is mounted on said one-piece molded plastic member, and said contact portion projects into a socket of said connector housing portion, wherein said conducting plastic circuit path is formed unitarily with said base member, and is at least partially embedded in said base member, thereby forming a one-piece molded plastic member, whereby said conducting plastic circuit path is formed into a desired circuit configuration within said base member.

7. The vehicle inner circuit panel according to claim 6, wherein said conducting plastic circuit path is generally coplanar with said base member, forming a generally flat surface on said one-piece molded plastic member, whereby said conducting plastic circuit path is exposed on the generally flat surface of said one-piece molded plastic member.

8. A vehicle inner circuit panel for use in a vehicle panel assembly, comprising:

a base member formed of an electrically insulating plastic material, a conducting plastic circuit path formed of an electrically conductive plastic material, wherein said conducting plastic circuit path is formed unitarily with said base member, and is at least partially embedded in said base member, thereby forming a one-piece molded plastic member, whereby said conducting plastic circuit path is formed into a desired circuit configuration within said base member, wherein said conducting plastic circuit path is generally coplanar with said base member, forming a generally flat surface on said one-piece molded plastic member, whereby said conducting plastic circuit path is exposed on the generally flat surface of said one-piece molded plastic member, and wherein a cover sheet made of a non-conductive soft plastic material is mounted on the generally flat surface of said one-piece molded plastic member to cover said conducting plastic circuit path.

9. A vehicle panel assembly, comprising:

a vehicle body panel, an interior trim panel engageable with said vehicle body panel, a plastic circuit panel disposed between said vehicle body panel and said interior trim panel, said plastic circuit panel having a base member formed of an electrically insulating plastic material and a conducting plastic circuit path formed of an electrically conductive plastic material, and an electrical component mounted on at least one of said vehicle body panel, interior trim panel and plastic circuit panel, wherein said electrical component is configured to be electrically connected to said conducting plastic circuit path, wherein said plastic circuit panel is a one-piece member formed by molding said conducting plastic circuit path unitarily with said base member, whereby said conducting plastic circuit path is formed into a desired circuit configuration, and wherein said plastic circuit panel comprises a first connector connected to said conducting plastic circuit path and configured for engagement with a mating connector of an outer wire harness that extends from outside said vehicle body panel, whereby said conducting plastic circuit path can be connected to the outer wire harness upon engagement of said first and mating connectors.

10. The vehicle panel assembly according to claim 9, wherein said plastic circuit panel further comprises a second connector which is connected to said conducting plastic circuit path and which is configured for engagement with a component side connector of an inner wiring member that extends from said electrical component, whereby said conducting plastic circuit path can be connected to said electrical component upon engagement of said second and component side connectors, and whereby said outer wire harness can be connected to said electrical component.

11. The vehicle panel assembly according to claim 9, further comprising an inner wire harness that extends from said electrical component to a second connector connected to said conducting plastic circuit path, whereby said conducting plastic circuit path can be connected to said electrical component when said inner wire harness is connected to said second connector, and whereby said outer wire harness can be connected to said electrical component.

12. The vehicle panel assembly according to claim 9, wherein said conducting plastic circuit path is embedded in said base member, and is generally coplanar with said base member, forming a generally flat surface on said plastic circuit panel, whereby said conducting plastic circuit path is exposed on the generally flat surface of said plastic circuit panel, and wherein an electrically insulating cover sheet is mounted on the generally flat surface of said plastic circuit panel to cover said conducting plastic circuit path.

13. A vehicle panel assembly wiring construction, comprising:

a vehicle body panel, a interior trim panel engageable with said vehicle body panel, an plastic circuit panel disposed between said vehicle body panel and said interior trim panel, said plastic circuit panel having a base member formed of an electrically insulating plastic material and a conducting plastic circuit path formed of an electrically conductive plastic material, an electrical component mounted on at least one of said vehicle body panel, interior trim panel and plastic circuit panel, a first connector connected to said conducting plastic circuit path at one end thereof, an outer wire harness having a power supply side connector connected thereto and engageable with said first connector, said outer wire harness extending from outside said vehicle body panel to supply power to said electrical component, a second connector connected to said conducting plastic circuit path at the other end thereof, and an inner wire harness having an electrical component side connector connected thereto and engageable with said second connector, said inner wire harness extending from said electrical component to said second connector, wherein said first and second connectors are respectively coupled to said power supply side and electrical component side connectors, whereby said outer wire harness is electrically connected to said electrical component through said conducting plastic circuit path and said inner wire harness, thereby supplying power to said electrical component.

14. The vehicle panel assembly wiring construction according to claim 13, wherein said plastic circuit panel is a one-piece member formed by molding said conducting plastic circuit path unitarily with said base member, whereby said conducting plastic circuit path is formed into a desired circuit configuration.

15. The vehicle panel assembly wiring construction according to claim 13, wherein said conducting plastic circuit path is embedded in said base member, and is generally coplanar with said base member, forming a generally flat surface on said plastic circuit panel, whereby said conducting plastic circuit path is exposed on the generally flat surface of said plastic circuit panel, and wherein an electrically insulating cover sheet is mounted on the generally flat surface of said plastic circuit panel to cover said conducting plastic circuit path.

* * * * *